US012756333B2

(12) United States Patent
Easton et al.

(10) Patent No.: US 12,756,333 B2
(45) Date of Patent: Oct. 6, 2026

(54) METHOD OF CONTROLLING POWER DELIVERED TO AN ACTUATOR ASSEMBLY

(71) Applicant: Cambridge Mechatronics Limited, Cambridge (GB)

(72) Inventors: Mark Easton, Cambridge (GB); Christopher Avery, Cambridge (GB); Nils Darphin, Cambridge (GB)

(73) Assignee: CAMBRIDGE MECHATRONICS LIMITED, Cambridge (GB)

( * ) Notice: Subject to any disclaimer, the term of this patent is extended or adjusted under 35 U.S.C. 154(b) by 0 days.

(21) Appl. No.: 18/877,288

(22) PCT Filed: Jun. 20, 2023

(86) PCT No.: PCT/GB2023/051604
§ 371 (c)(1),
(2) Date: Dec. 20, 2024

(87) PCT Pub. No.: WO2023/247940
PCT Pub. Date: Dec. 28, 2023

(65) Prior Publication Data

US 2025/0385623 A1 Dec. 18, 2025

(30) Foreign Application Priority Data

Jun. 22, 2022 (GB) ...................................... 2209183

(51) Int. Cl.
*G03B 3/10* (2021.01)
*H02N 11/00* (2006.01)
(Continued)

(52) U.S. Cl.
CPC ............. *H02N 11/006* (2013.01); *G03B 3/10* (2013.01); *H03K 3/017* (2013.01); *H03K 7/08* (2013.01); *G03B 2205/0076* (2013.01)

(58) Field of Classification Search
CPC .... F03G 7/06143; F03G 7/062; F03G 7/0665; G02B 7/02; G03B 3/10;
(Continued)

(56) References Cited

U.S. PATENT DOCUMENTS

2013/0300880 A1* 11/2013 Brown .................... F03G 7/062
348/208.1
2018/0149824 A1* 5/2018 Kim ....................... G02B 7/023
(Continued)

FOREIGN PATENT DOCUMENTS

GB 2601833 A 6/2022
WO 2020008217 A1 1/2020

OTHER PUBLICATIONS

International Search Report and Written Opinion for Application No. PCT/GB2023/051604 dated Oct. 26, 2023 (47 pages).
(Continued)

*Primary Examiner* — Levi Gannon
(74) *Attorney, Agent, or Firm* — Van Hoven PC; Stefan D. Osterbur; Joshua Van Hoven

(57) ABSTRACT

A method of controlling power delivered to an actuator assembly (2) comprising at least four actuator components (30) arranged, on actuation, to move a movable part (20) relative to a support structure (10), the method comprising: • scheduling PWM control signals comprising a series of PWM pulses for driving actuation of the at least four actuator components, wherein the PWM pulses are scheduled in a series of time slots defined by a PWM frequency, each time slot being divided into a plurality of sub-slots; • and sorting the PWM pulses by width into pairs, wherein each pair of PWM pulses is scheduled in a respective sub-slot and is allowed to overlap in the respective sub-slot.

11 Claims, 4 Drawing Sheets

(51) Int. Cl.
*H03K 3/017* (2006.01)
*H03K 7/08* (2006.01)

(58) Field of Classification Search
CPC .... G03B 2205/0015; G03B 2205/0076; H02N 11/006; H03K 3/017; H03K 7/08
See application file for complete search history.

(56) References Cited

U.S. PATENT DOCUMENTS

| | | | | |
|---|---|---|---|---|
| 2020/0116135 | A1* | 4/2020 | Kim | G02B 7/08 |
| 2022/0106941 | A1 | 4/2022 | Easton | |
| 2022/0196967 | A1* | 6/2022 | Dai | G03B 3/10 |

OTHER PUBLICATIONS

Search Report for Application No. GB2209183.9 dated Nov. 16, 2022 (6 pages).

* cited by examiner

METHOD OF CONTROLLING POWER DELIVERED TO AN ACTUATOR ASSEMBLY

CROSS-REFERENCE TO RELATED APPLICATIONS

The present application is a U.S. National Phase Application under 35 U.S.C. 371 of International Patent Application No. PCT/GB2023/051604, filed Jun. 20, 2023, which claims priority to GB Patent Application No. 2209183.9, filed on Jun. 22, 2022, each of which is hereby incorporated by reference herein in its entirety.

FIELD

The present application relates to a method of controlling power delivered to an actuator assembly, as well as an actuator assembly. Specifically, the present application relates to overlapping PWM pulses supplied to actuator components that move a movable part relative to a support structure.

BACKGROUND

There are a variety of types of actuator assembly in which it is desired to provide positional control of a movable part relative to a support structure. Such actuator assemblies may be used in cameras, in which a lens element and an image sensor are moved relative to each other. For example, WO 2011/104518 A1 discloses a SMA actuator assembly in which eight SMA wires are used to move a lens element relative to an image sensor, thus optical image stabilization (OIS) and/or auto-focus (AF).

Contraction of SMA wires, and so movement of a lens or other movable element, may be controlled using PWM control signals. These PWM control signals may be provided in sequential time-slots at a PWM frequency. WO 2020/008217 A1, for example, shows PWM control signals that are provided sequentially so as not to overlap.

The total power deliverable to SMA wires or other actuator components using such non-overlapping PWM pulses may be limited.

SUMMARY

According to an aspect of the present invention, there is provided a method of controlling power delivered to an actuator assembly comprising at least four actuator components arranged, on actuation, to move a movable part relative to a support structure, the method comprising: scheduling PWM control signals comprising a series of PWM pulses for driving actuation of the at least four actuator components, wherein the PWM pulses are scheduled in a series of time slots defined by a PWM frequency, each time slot being divided into a plurality of sub-slots; and sorting the PWM pulses by width into pairs, wherein each pair of PWM pulses is scheduled in a respective sub-slot and is allowed to overlap in the respective sub-slot.

According to another aspect of the present invention, there is provided an actuator assembly comprising a support structure; a movable part that is movable relative to the support structure; at least four actuator components arranged, on actuation, to move the movable part relative to the support structure; and a controller configured to: schedule PWM control signals comprising a series of PWM pulses for driving actuation of the at least four actuator components, wherein the PWM pulses are scheduled in a series of time slots defined by a PWM frequency, each time slot being divided into a plurality of sub-slots; and sort the PWM pulses by width into pairs, such that each pair of PWM pulses is applied in a respective sub-slot and is allowed to overlap in the respective sub-slot.

According to another aspect of the present invention, there is provided a method for controlling power delivered to an actuator assembly comprising at least two actuator components arranged, on actuation, to move a movable part relative to a support structure, the method comprising: scheduling PWM control signals comprising a series of PWM pulses for driving actuation of the at least two actuator components, wherein at least some of the PWM pulses overlap; increasing the duty and/or amplitude of overlapping PWM pulses in dependence on the width of overlap so as to compensate for electrical resistance in a common connection to the actuator components driven by the overlapping pulses, to thereby reduce the power loss due to the electrical resistance in the common connection compared to a situation in which there is no common connection to the actuator components.

According to another aspect of the present invention, there is provided an actuator assembly comprising a support structure; a movable part that is movable relative to the support structure; at least two actuator components arranged, on actuation, to move the movable part relative to the support structure; a controller configured to schedule PWM control signals comprising a series of PWM pulses for driving actuation of the at least two actuator components, wherein at least some of the PWM pulses overlap; and electrical connections from the controller to the at least two actuator components for supplying the PWM control signals to the actuator components, wherein the electrical connections comprises a common connection that is shared among the at least two actuator components; wherein the controller is configured to increase the duty and/or amplitude of overlapping PWM pulses in dependence on the width of overlap so as to compensate for electrical resistance in the common connection, to thereby reduce the power loss due to the electrical resistance in the common connection compared to a situation in which there is no common connection to the actuator components.

According to another aspect of the present invention, there is provided a method for controlling power delivered to an actuator assembly comprising at least two actuator components arranged, on actuation, to move a movable part relative to a support structure, the method comprising: scheduling PWM control signals comprising a series of PWM pulses for driving actuation of the at least two actuator components; selectively operating in i) a low-power mode in which PWM pulses are applied sequentially, and ii) a high-power mode in which PWM pulses overlap.

Further aspects of the present invention are set out in the dependent claims and in the detailed description.

BRIEF DESCRIPTION OF THE DRAWINGS

Certain embodiments of the present invention will now be described, by way of example only, with reference to the accompanying drawings in which.

DETAILED DESCRIPTION

Camera Apparatus

Figure 1:
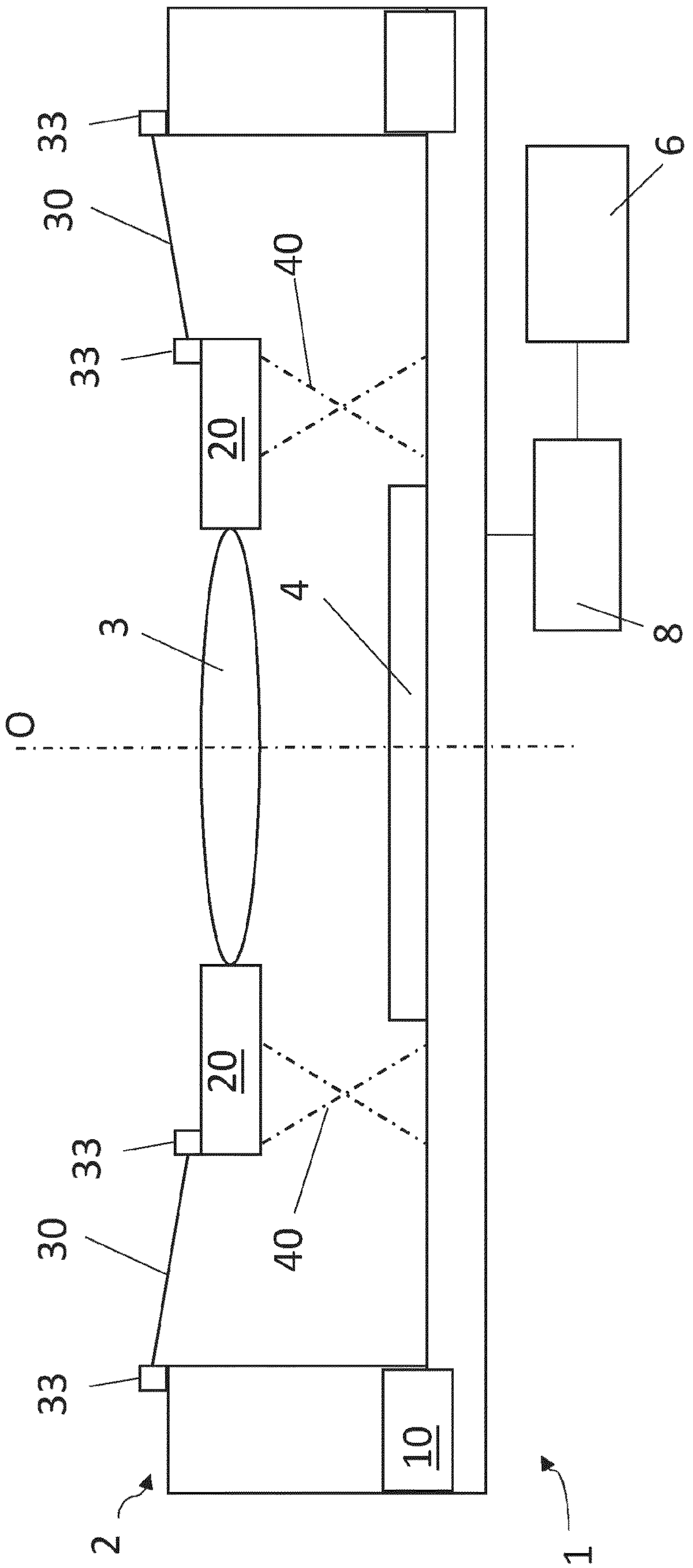
FIG. 1 is a schematic view of an actuator assembly according to embodiments of the present invention.

FIG. 1 schematically shows an apparatus 1 in accordance with an embodiment of the present invention. The apparatus 1 is, for example, a camera apparatus 1. The apparatus 1 is to be incorporated in a portable electronic device such as a mobile telephone, or tablet computer. Thus, miniaturisation is an important design criterion.

The apparatus 1 comprises an actuator assembly 2 or may itself be considered an example of an actuator assembly 2. The actuator assembly 2 comprises a support structure 10 and a movable part 20. The movable part 20 is supported on the support structure 10. The movable part 20 is movable relative to the support structure 10. For example, the movable part 20 may be supported in a manner allowing movement of the movable part 20 relative to the support structure 10 in a plane orthogonal to an axis O. Movement along the axis O may be constrained or prevented.

Alternatively or additionally, the movable part 20 is supported in a manner allowing movement of the movable part 20 relative to the support structure 10 along the axis O. Movement orthogonal to the axis O may be constrained or prevented. The axis O coincides with the optical axis O of optical components (such as a lens 3) of the apparatus 1.

The actuator assembly 2 of FIG. 1 comprises one or more SMA wires 30. The SMA wires 30 are connected between the support structure 10 and the movable part 20. The SMA wires 30 are connected at their ends to the support structure 10 and/or to the movable part 20 using connection elements 33, for example crimp connections. The crimp connections may crimp the SMA wires 30 to hold the SMA wires 30 mechanically, as well as providing electrical connections to the SMA wires 30. However, any other suitable connections may alternatively be used. The SMA wires 30 are capable, on selective contraction, of driving movement of the movable part 20 relative to the support structure 10 in one or more degrees of freedom.

The movable part 20 may be supported (so suspended) on the support structure 10 exclusively by the SMA wires 30. However, preferably, the actuator assembly 2 comprises a bearing arrangement 40 that supports the movable part on the support structure 10. The bearing arrangement 40 may have any suitable form for allowing movement of the movable part 20 with respect to the support structure 10. For this purpose, the bearing arrangement 40 may, for example, comprise a rolling bearing (such as a roller bearing or ball bearing), a flexure bearing (i.e. an arrangement of flexures or other resilient elements guiding movement), or a plain bearing or sliding bearing.

The camera apparatus 1 further comprises a lens assembly 3 and an image sensor 4. The lens assembly 3 comprises one or more lenses configured to focus an image on the image sensor 4. The image sensor 4 captures an image and may be of any suitable type, for example a charge coupled device (CCD) or a CMOS device. The lens assembly 3 comprises a lens carrier, for example in the form of a cylindrical body, supporting the one or more lenses. The one or more lenses may be fixed in the lens carrier, or may be supported in the lens carrier in a manner in which at least one lens is movable along the optical axis O, for example to provide zoom or focus, such as auto-focus (AF). The apparatus 1 may be a miniature camera apparatus in which the or each lens of the lens assembly 3 has a diameter of 20 mm or less, preferably of 12 mm or less.

In the embodiment shown in FIG. 1, the movable part 20 may be considered to comprise the lens assembly 3. The image sensor 4 may be fixed relative to the support structure 10, i.e. mounted on the support structure 10. In other embodiments (not shown), the lens assembly 3 may be fixed relative to the support structure 10 and the movable part 20 may comprise the image sensor 4. In either embodiment, in operation the lens assembly 3 is moved relative to the image sensor 4. This has the effect that the image on the image sensor 4 is moved and/or changed in focus. So, optical image stabilization (OIS) or autofocus (AF) or other focus or zoom functionality may be implemented in the apparatus 1.

The camera apparatus 1 further comprises a controller 8. The controller 8 may be implemented in an integrated circuit (IC) chip. The controller 8 generates drive signals for the SMA wires 30. SMA material has the property that on heating it undergoes a solid-state phase change that causes the SMA material to contract. Thus, applying drive signals to the SMA wires 30, thereby heating the SMA wires 30 by allowing an electric current to flow, will cause the SMA wires 30 to contract and move the movable part 20. The drive signals are chosen to drive movement of the movable part 20 in a desired manner, for example so as to achieve OIS by stabilizing the image sensed by the image sensor 4 and/or to achieve AF by focusing the image on the image sensor 4. The controller 8 supplies the generated drive signals to the SMA wires 30.

Optionally, the camera apparatus comprises an inertial measurement unit 6. The inertial measurement unit 6 may comprise one or more vibration sensors, such as gyroscopes, accelerometers or magnetometers, although in general other types of sensors could be used. The inertial measurement unit 6 detects changes in the orientation of and/or the forces on the camera apparatus 1 and generates sensor signals representative of the orientation of and/or forces on the camera apparatus 1. The controller 8 receives the sensor signals and generates the drive signals for the SMA wires 30 in response to the sensor signals, for example so as to counteract the changes in orientation and/or forces represented by the output signals. The controller 8 may thus control the SMA wires 30 to achieve OIS.

In embodiments of the apparatus 1, OIS is performed. In such embodiments, the apparatus 1 may comprise the SMA actuation apparatus described in WO2013/175197 A1, or the SMA actuation apparatus of WO 2011/104518 A1, or the camera assembly of WO2017/072525, each of which is herein incorporated by reference. In other embodiments of the apparatus 1, AF is performed. In such embodiments, the apparatus 1 may comprise the camera lens actuation apparatus of WO2007/113478 A1 or the SMA actuation apparatus of WO 2019/243849, each of which is herein incorporated by reference.

Generally, however, the apparatus 1 according to the present invention is any apparatus 1 comprising an actuator assembly 2 in which an actuator component, such as an SMA wire 30, drives movement of a movable part 20 relative to a support structure 10.

Pulse Width Modulated (PWM) Drive Signals

The controller 8 generates and supplies drive signals P1-P8 for the SMA wires 30. Such drive signals P1-P8 are shown in FIGS. 2A-C and 3A-C, for example. The drive signals are pulse width modulated (PWM) drive signals P1-P8. The controller 8 may generate and supply a respective PWM drive signal P1-P8 to each SMA wire 30. For example, as shown in the Figures, the controller 8 may generate and supply eight PWM drive signals P1-P8 to eight respective SMA wires 30. In general, the controller 8 may generate any number of PWM control signals P1-P8 to control any number of SMA wires 30, such as four PWM control signals P1-P4 to control four SMA wires 30 or six PWM control signals P1-P6 to control six SMA wires 30.

The PWM control signals P1-P8 each comprise a series of PWM pulses 50. The frequency of the pulses is the PWM frequency f(PWM). The period between starts of adjacent pulses in the PWM control signals P1-P8 is the PWM period t(PWM). The PWM period t(PMW) corresponds to the reciprocal of the PWM frequency f(PWM).

The controller 8 schedules the PWM pulses 50 in a series of time slots TS1-TSn. The time slots are defined by a PWM frequency f(PWM). The duration of each time slot TS is equal to the PWM period t(PWM). Each SMA wire 30 is supplied with a respective PWM pulse 50 once (or not at all, if no power is to be provided to an SMA wire 30) per time slot TS.

Each time slot TS1-TSn is divided into a plurality of sub-slots ss1-ss4. Each time slot TS consists of the plurality of sub-slots ss1-ss4. The plurality of sub-slots ss1-ss4 together form a time slot TS. Each PWM pulse 50 is provided in a sub-slot ss1-ss4.

The controller 8 operates at a servo frame frequency f(SF). The controller 8 updates the PWM control signals P1-P8 at most at the servo frame frequency f(SF), so once per servo frame SF. The pulse width of the PWM pulses P1-P8 may be updated once per servo frame SF. So, the PWM control signals P1-P8 generally remain the same within a servo frame SF, although some predetermined deviation within some time slots TS may be allowed for the purpose of scheduling measurement pulses, for example.

The pulses of the PWM control signals P1-P8 may comprise voltage pulses or current pulses. In general, the pulses may be any pulses capable of supplying electrical energy to the SMA wires 30.

The pulses of the PWM control signals P1-P8 are preferably square pulses, as shown in the Figures, although in general pulses with other shapes may also be used. Switching the PWM control signals P1-P8 thus gives rise to rising or falling edges in the PWM control signals.

The amplitude of the pulses of the PWM control signal P1-P8 is preferably constant, such that the power applied to the SMA wires 30 is controlled solely or at least primarily by adjusting the width of the pulses of the PWM control signals P1-P8. In some embodiments, the amplitude of the PWM control signals P1-P8 may also be adjusted so as to provide additional control of the power provided to the SMA wires 30.

Measure of Resistance

In addition to generating the PWM control signals P1-P8, the controller 8 may measure an electrical characteristic, such as the resistance, of the SMA wires 30. The length of the SMA wire 30 is a function of the resistance of the SMA wire 30. The measured electrical characteristic may thus provide a measure of the length of a respective SMA wire 30, and so ultimately allows determination of the position of the movable part 20 relative to the support structure 10. The determined position of the movable part 20 relative to the support structure 10 may be compared to a desired position of the movable part 20 relative to the support structure 10, and the PWM control signal P1-P8 may be adjusted to bring the movable part 20 closer to the desired position. So, the controller 8 may comprise closed loop control (e.g. a PID controller) to generate the PWM control signals P1-P8. The measured electrical characteristic, or a measure (such as the length of the SMA wires 30) derived from the measured electrical characteristic may be fed back to the closed loop control.

The controller 8 may determine the electrical characteristic of an SMA wire 30 during a respective sensing interval. During the sensing interval, the controller 8 may generate a measurement pulse 60. The PWM control signals P1-P8 that are used to drive the SMA wires 30 may be suspended. In general, specifically the PWM control signal of the SMA wire 30 to which the measurement pulse 60 is to be applied may be suspended, or all PWM control signals P1-P8 may be suspended.

The controller 8 may determine the electrical characteristics of each SMA wire 30 once per servo frame, for example. If there are eight SMA wires 30, the controller 8 may generate eight measurement pulses per servo frame. Each measurement pulse 60 may be applied to a different SMA wire 30 so as to determine the electrical characteristic of the eight SMA wires 30. The measurement pulses 60 may be applied sequentially, i.e. measurement pulses 60 may not overlap.

The measurement pulse 60 may be square voltage pulse. However, the measurement pulse 60 may in general be any other pulse (for example a current pulse) that allows measuring of the electrical characteristic of the SMA wire 30. The measurement pulse 60 is not necessarily a square pulse, but may be a pulse with a slower or gradual onset and a slower or gradual descent. This may advantageously reduce any EMI in the image sensor 4 due to the measurement pulse 60. In general, the measurement pulse 60 may have any shape.

The measurement pulse and the PWM control signals may be generated by different sources. For example, the PWM control signals may be generated by a voltage source, and the measurement pulse may be generated by a current source (e.g. a constant current source). The measurement pulse and the PWM control signals may be of a different type (e.g. one a current pulse, the other a voltage pulse), or may be of the same type (e.g. both current pulses, or both voltage pulses).

Overlapping PWM Pulses

In conventional SMA wire control, the PWM control signals may not overlap, so the pulses of the PWM control signals P1-P8 are scheduled to be generated sequentially and not concurrently. The PWM control signals P1-P8 may thus be interleaved without allowing any overlap.

In accordance with the present invention, at least some of the pulses 50 of the PWM control signals P1-P8 overlap, at least in certain situations. This increases the power that is deliverable to the SMA wires 30 compared to a situation in which there is no provision for such overlap.

One aspect of the present invention relates to sorting the PWM pulses 50 by width into pairs. The width of a PWM pulse 50 corresponds to the duration of the PWM pulse 50. Put another way, the PWM pulses 50 may be paired up or grouped by width into pairs. So, relatively wider PWM pulses 50 are paired up and relative narrower PWM pulses 50 are paired up. The PWM pulses 50 are sorted or paired up in order of ascending or descending width.

Each pair of PWM pulses 50 is scheduled in a respective sub-slot ss1-ss4 and is allowed to overlap in the respective sub-slot ss1-ss4. The PWM pulses 50 in a respective sub-slot ss1-ss4 overlap in certain situations, for example when relatively high power is to be provided to the SMA wires 30. The PWM pulses 50 in a respective sub-slot ss1-ss4 need not overlap in all situations. For example, when relative low power is to be provided to the SMA wires 30, the PWM pulses 50 may not be required to overlap.

So, exactly two PWM pulses 50 are provided in each sub-slot ss1-ss4. At most two PWM pulses 50 are allowed to overlap. This reduces complexity of control and the influence of parasitic effects on the PWM pulses 50 compared to a situation in which three or more PWM pulses 50 are provided and allowed to overlap in a sub-slot ss1-ss4, while increasing the overall power deliverable to the SMA wires 30.

Figure 2A:
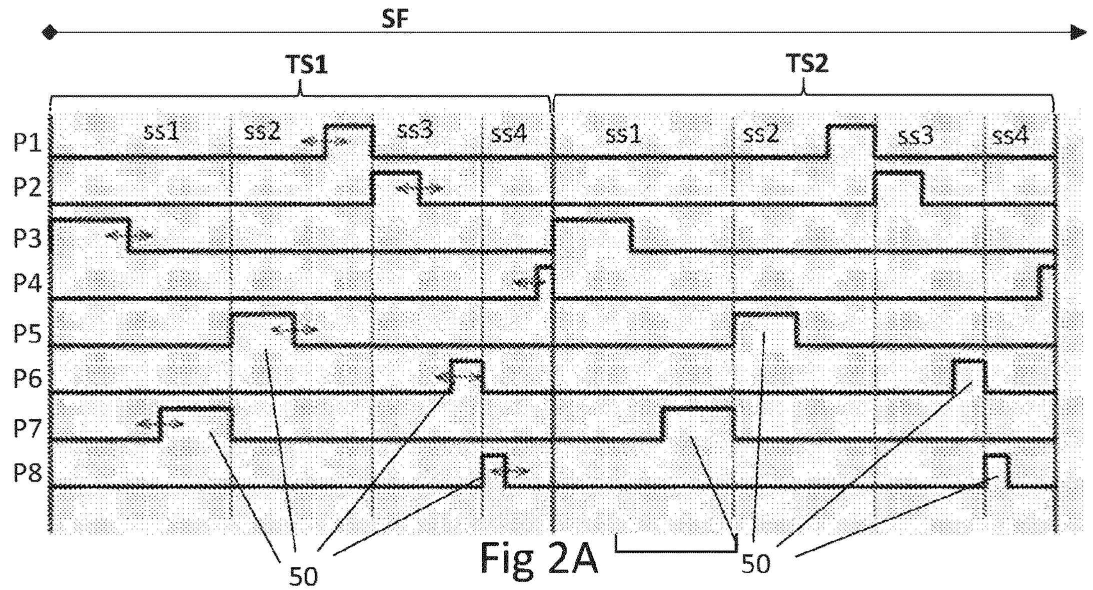
FIGS. 2A-2C are schematic views of PWM control signals applied to actuator components of the actuator assembly of FIG. 1, in accordance with embodiment of the present invention.
Figure 2B:
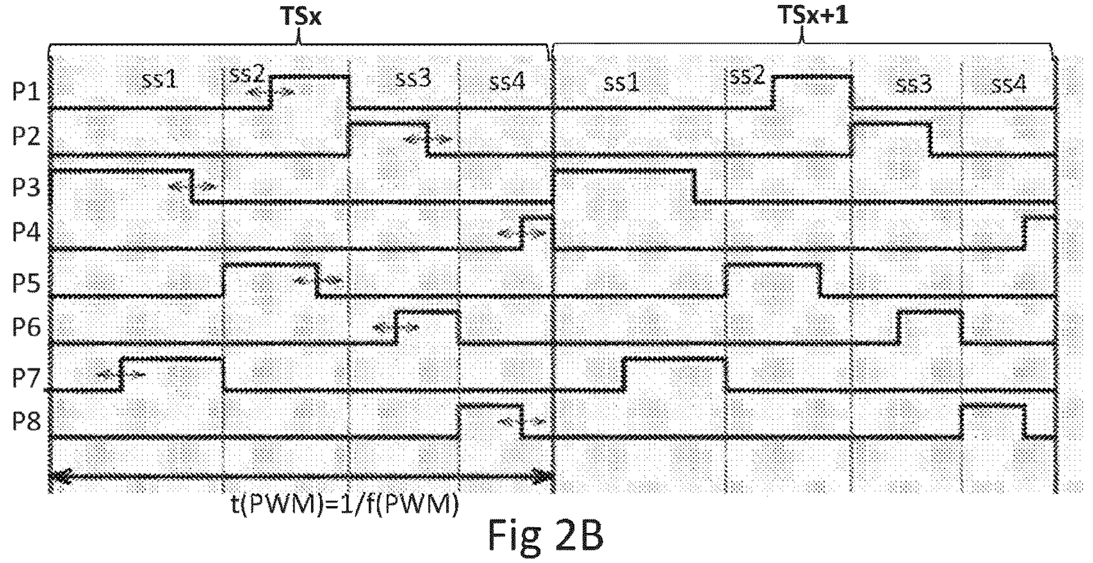

With reference to FIG. 2B, for example, the PWM pulses 50 of PWM control signals P3 and P7 are the two widest PWM pulses 50 and so are paired up. The pair of PWM pulses corresponding to PWM control signals P3 and P7 are provided in sub-slot ss1. The PWM pulses 50 of PWM control signals P1 and P5 are the third and fourth widest PWM pulses 50, and so are paired up and provided in sub-slot ss2. The PWM pulses 50 of PWM control signals P2 and P6 are the fifth and sixth widest PWM pulses 50, and so are paired up and provided in sub-slot ss3. The PWM pulses 50 of PWM control signals P4 and P8 are narrowest two PWM pulses 50, and so are paired up and provided in sub-slot ss4.

Frequency of Sorting PWM Pulses into Pairs

Figure 2C:
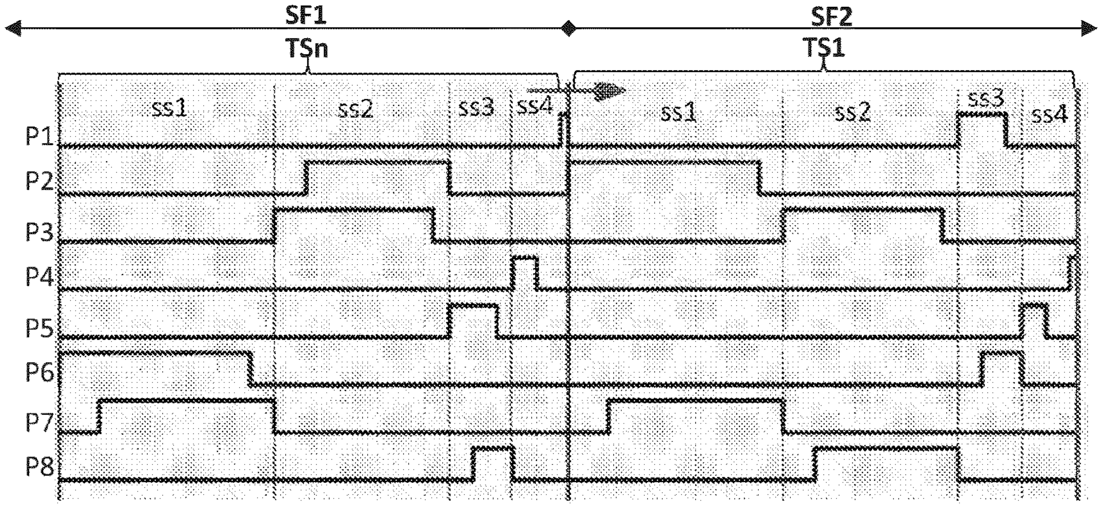

FIG. 2C schematically depicts the final time slot TSn of a servo frame SF1 and the first time slot TS1 of a subsequent servo frame SF2. The PWM control signals P1-P8 are adjusted at the servo frame boundary. The PWM pulses 50 are sorted, specifically re-sorted, when the PWM control signals P1-P8 are updated or change.

In the final time slot TSn of servo frame SF1 (or generally in servo frame SF1), PWM control signals P6 and P7 comprise the two widest PWM pulses 50. So, the PWM pulses 50 of PWM control signals P6 and P7 are paired up and provided in the same sub-slot ss1. However, in the first time slot TS1 of servo frame SF2 (or generally in servo frame SF2), i.e. after the controller updates the PWM control signals P1-P8, PWM control signals P2 and P7 comprise the two widest PWM pulses 50. As such, the PWM pulses 50 of PWM control signals P2 and P7 are paired up and provided in the same sub-slot ss1. The PWM pulses 50 of the other PWM control signals are also paired appropriately.

FIG. 2C shows and embodiment in which the PWM pulses 50 are periodically sorted by width into pairs. Specifically, the PWM pulses 50 may be sorted by width into pairs at the servo frame frequency, i.e. at the beginning of each servo frame. This may, specifically when the width of the PWM pulses 50 changes sufficiently, lead to a new pairing up of PWM pulses 50. In some instances, the width of the PWM pulses 50 may not change, or not change significantly, at the servo frame boundary. In such instances, the PWM pulses 50 may not be re-sorted.

In some embodiments, the PWM pulses 50 may be sorted by width into pairs periodically upon modification of the widths of the PWM pulses 50. So, the step or sorting the PWM pulses 50 may be taken whenever the width of the PWM pulses is modified.

Such re-sorting whenever the PWM pulse width changes may, however, in some situations lead to undesirable audible noise. This is the case, for example, when the servo frame frequency is within the audible range and PWM pulses of different pairs have similar widths. Such undesirable audible noise may be avoided or at least reduced by techniques that avoid re-sorting of the PWM pulses 50 at every servo frame boundary.

In some embodiments, PWM pulses 50 may be sorted by width into pairs only when required, for example because a PWM pulse 50 does not fit within a respective sub-slot. So, upon modification of the width of PWM pulses, a determination may be made of whether the width of any PWM pulse 50 is scheduled to be greater than the width of a respective sub-slot ss1-ss2. With reference to FIG. 2C, for example, at the servo frame boundary it may be determined that the PWM pulse 50 of PWM control signal P2 no longer fits into the previously allocated sub-slot ss2. This may trigger re-sorting of the PWM pulses 50 in the manner shown in FIG. 2C.

The PWM pulses 50 may thus be sorted by width into pairs upon positive determination that a modified PWM pulse 50 does not fit within a respective sub-slot. The PWM pulses 50 may be re-sorted only upon such positive determination. This may reduce the number of times that the PWM pulses 50 need re-sorting, and so may reduce the amount of audible noise resulting from such re-sorting.

In some other embodiments, a determination may be made if the width of a PWM pulse 50 previously sorted into a lower-width pair (e.g. PWM pulse P2-50 of the P2/P3 pair in FIG. 2C) exceeds the width of another PWM pulse 50 previously sorted into a higher-width pair (e.g. PWM pulse P6-50 of the P6/P7 pair in FIG. 2C) by more than a threshold. The PWM pulses 50 may be sorted by width into pairs upon positive determination thereof, specifically only upon positive determination thereof. The threshold may be 1%, preferably 5%, further preferably 10% of the width of the PWM pulse 50 previously sorted into the lower-width pair. This may reduce the number of times that the PWM pulses 50 need re-sorting, and so may reduce the amount of audible noise resulting from such re-sorting.

Arrangement of PWM Pulses within Sub-Slots

As shown in the Figures, within each sub-slot ss1-ss2, a first PWM pulse 50 of the respective pair may start at the beginning of the sub-slot and a second PWM pulse 50 of the respective pair may end at the end of the sub-slot.

This ensures that there is overlap within a sub-slot only when such overlap is unavoidable because of the width of the PWM pulses 50 within a sub-slot. FIG. 2A, for example, schematically depicts a low-power operation of the SMA wires 30. The width of the PWM pulses 30 is low enough to avoid overlap between PWM pulses 50, reducing the complexity of SMA wire control and avoiding complications and power loss due to parasitic effects. Only when the power requirement of the SMA wires 30 increases, and the PWM pulses 50 are widened as a result, the PWM pulses 50 in a pair overlap. This is shown in FIG. 2B. The amount of overlap between PWM pulses 50 in a pair is minimized compared to a situation in which both PWM pulses 50 in a pair start at the beginning of a sub-slot ss1-ss4.

Duration of Sub-Slots

The width of the sub-slots ss1-ss4 may be variable. FIGS. 2A-2C, for example, show sub-slots of varying width. The width of sub-slots ss1-ss4 is variable to account for the varying widths of PWM pulses 50 within these sub-slots ss1-ss4.

The width of each sub-slot ss1-ss4 may be varied upon the sorting the PWM pulses 50 by width into pairs. So, the width of each sub-slot ss1-ss4 may be varied whenever the width of the PWM pulses 50 is modified, or under any other conditions for (re-)sorting the PWM pulses 50 set out herein.

In general, the width of each sub-slot ss1-ss4 may be set such that the PWM pulses 50 allocated to the respective sub-slot ss1-ss4 fit into the sub-slot ss1-ss4. So, the width of each sub-slot ss1-ss4 may be set to be equal or greater than the width of the widest PWM pulse 50 in the sub-slot ss1-ss4.

Preferably, the width of each sub-slot ss1-ss4 is equal to the sum of i) the width of the widest PWM pulse in the sub-slot and ii) a portion of the spare slot width available in the time slot after summing the widths of the widest PWM pulses 50 of the pairs. With reference to FIG. 2B, for example, each sub-slot ss1-ss4 is wider than either of the PWM pulses 50 in the sub-slot. The spare slot width is equal to the duration of the time slot TSx minus the pulse width of PWM control signals P3, P5, P2 and P8, which correspond to the wider PWM pulses in each pair P3/P7, P1/P5, P2/P6 and P4/P8.

In some embodiments, the portion of the spare slot width is equal for each sub-slot ss1-ss4. So, each sub-slot ss1-ss4 has an equal amount of spare slot width.

In alternative embodiments, the portion of the spare slot width in each sub-slot ss1-ss4 is proportional to the width of the widest PWM pulse in the sub-slot. In general, any other method of distributing the spare slot width among the sub-slots ss1-ss4 may be used.

Measurement Pulses

As already described, in some embodiments, measurement pulses may be scheduled to allow measuring of an electrical characteristic of an actuator component. In relation to SMA wires 30, for example, the measurement pulses may allow determination of a measure of the resistance of the SMA wires 30.

Figure 3A:
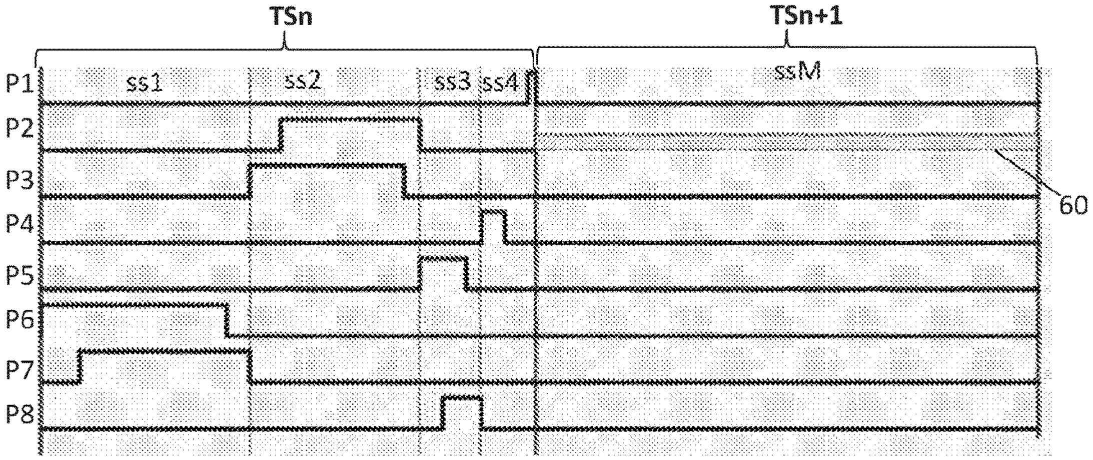
FIGS. 3A-3C are schematic views of PWM control signals and measurement pulses applied to actuator components of the actuator assembly of FIG. 1, in accordance with embodiment of the present invention.
Figure 3B:
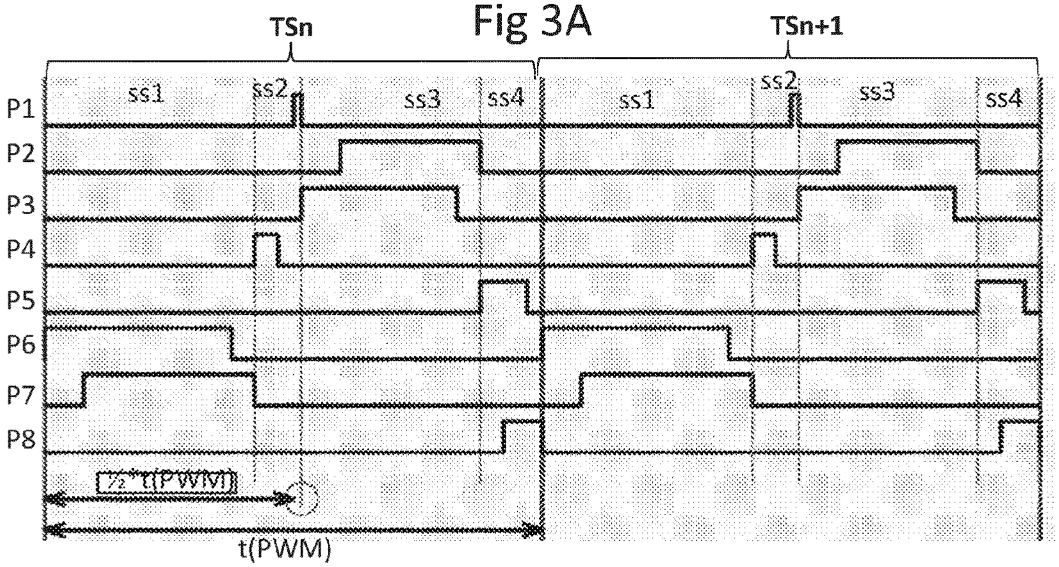

FIGS. 3A-3B schematically depict embodiments of scheduling a measurement pulse 60 for measuring an electrical characteristic of the actuator component.

The measurement pulse 60 may, for example, be scheduled in a dedicated measurement sub-slot ssM. The measurement sub-slot ssM may be provided in a fixed proportion of a time slot TS of the series of time slots TS1-TSn. For example, as shown in FIG. 3A, the measurement sub-slot ssM may be provided for the entire duration a selected time slot TSn+1. The measurement sub-slot ssM may thus replace the sub-slots ss1-ss4 in which the PWM pulses 50 are ordinarily provided. The PWM pulses 50 may be suppressed during the measurement sub-slot ssM, such that no PWM pulses 50 are scheduled during the measurement sub-slot ssM. The measurement pulse 60 is scheduled in the measurement sub-slot, for example for the entire duration of the measurement sub-slot ssM (as shown in FIG. 3A) or for a portion of the measurement sub-slot ssM.

Figure 3C:
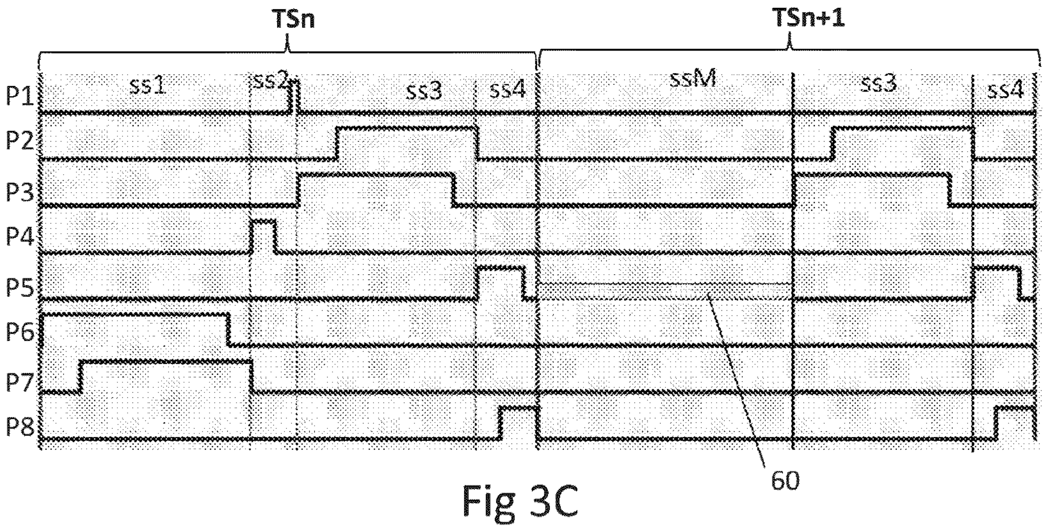

In other embodiments, as shown in FIG. 3C, the measurement sub-slot ssM may be provided in half of a time slot TS of the series of time slots TS1-TSn. The measurement sub-slot ssM may be provided in the first half or in the second half of the time slot TS. The measurement pulse 60 may be scheduled for the entire duration of the measurement sub-slot ssM (as shown in FIG. 3C) or for a portion of the measurement sub-slot ssM.

In order to facilitate this, the sub-slots ss1-ss4 may be arranged appropriately, as shown in FIG. 3B, for example. Here, the PWM pulses 50 of eight PWM control signals P1-P8 are sorted by width into four pairs. Each pair is scheduled in a respective sub-slot ss1-ss4. The sub-slots ss1-ss4 are arranged such that a shortest sub-slot ss2 in which the shortest PWM pulse 50 is applied and a longest sub-slot ss1 in which the longest PWM pulse 50 is applied are scheduled adjacent to one another. In FIG. 3B, the shortest and longest sub-slots ss2, ss1 are scheduled at the beginning of the time slot TS, but in generally the shortest and longest sub-slots ss2, ss1 may equally be scheduled at the end of the time slot TS.

The portion of the spare slot width allocated to the shortest and to the longest sub-slots may be such that the width of the combination of the shortest and the longest sub-slot is half of the time slot TS. Although the embodiments herein describe a measurement sub-slot ssM replacing selected sub-slots ss1-ss4, in general the measurement sub-slot ssM may be provided in addition to the sub-slots ss1-ss4. Such a further sub-slot may be provided, for example, at the beginning or at the end of each time slot TS, or at the beginning or end of select time slots TS.

Power Compensation for Pulse Overlap

One complication of allowing pulses to overlap lies in the presence of shared parasitic resistances affecting the power delivered to the SMA wires 30. This is explained with reference to FIG. 4.

Figure 4:
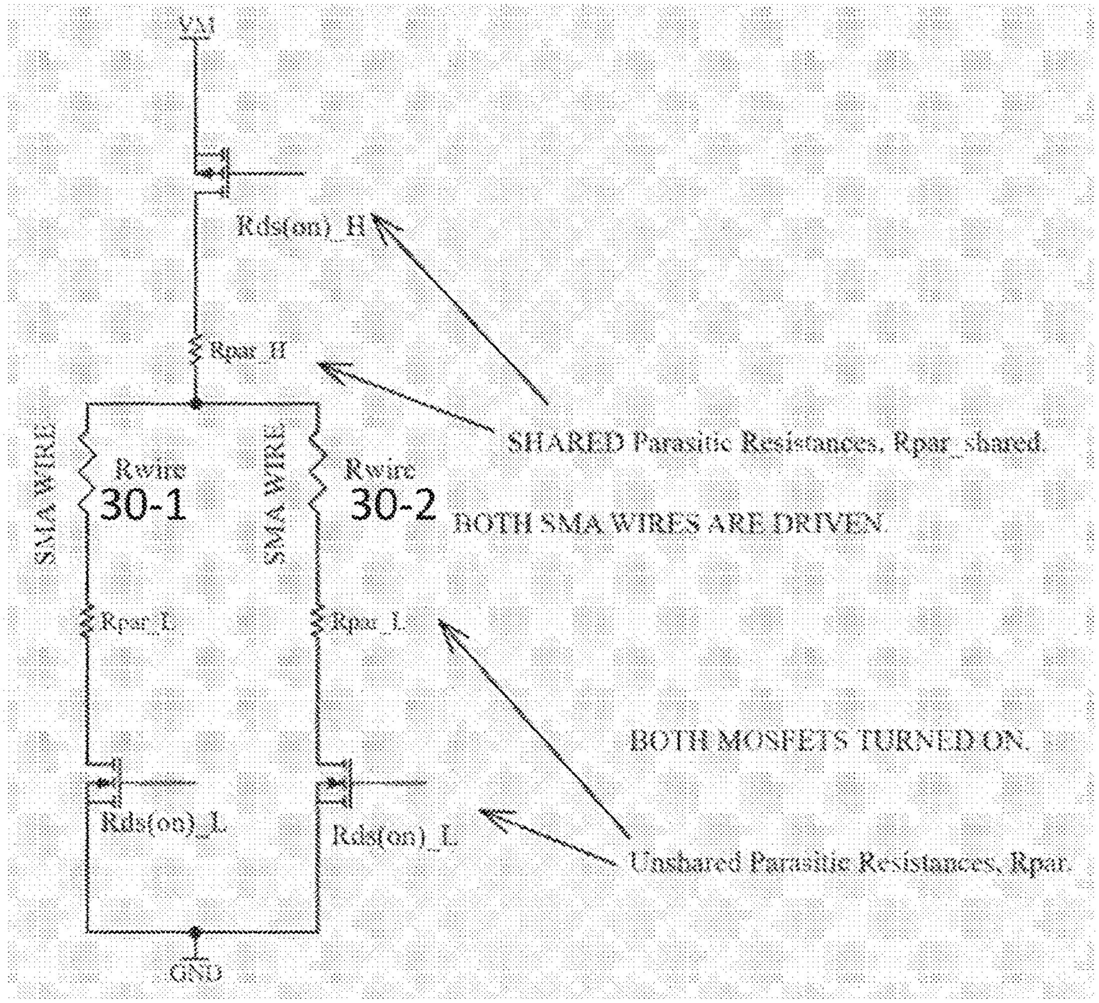
FIG. 4 is a schematic circuit diagram illustrating parasitic resistances in an arrangement of two SMA wires.

FIG. 4 schematically shows a circuit for supplying PWM pulses to an arrangement of two SMA wires 30-1, 30-2. The PWM pulses supplied to the SMA wires 30 may flow through a common electrical connection (in the upper part of the circuit of FIG. 4), as well as individual electrical connections (in the lower part of the circuit of FIG. 4). Both the as individual electrical connections and the common electrical connection give rise to undesired parasitic resistances.

When two pulses overlap, and the two SMA wires 30 to which the overlapping PWM pulses are applied have a shared parasitic resistance in the common connection, both SMA wires 30 will receive less power during the period of simultaneous drive. This may be corrected for by increasing the width of the PWM pulses.

The power correction is given by:

$$C = \left( \frac{(R_{PAR} + 2R_{PAR\_shared} + R_{Wire})^2}{(R_{PAR} + R_{PAR\_shared} + R_{Wire})^2} \right)$$

Where $R_{PAR\_shared}$ is the sum of all the shared parasitic resistances, $R_{PAR}$ is the sum of the remaining parasitic resistances which are not shared, and $R_{Wire}$ is the typical resistance of the SMA wire.

The pulse width W may be corrected to W', using the formula:

$$W' = W + V(C - 1)$$

where V is the width of the overlap period.

In accordance with the present invention, the width of overlapping PWM pulses is adjusted to compensate for electrical resistance in a common connection to the actuator components driven by the overlapping pulses. This aspect of the present invention applies to any overlapping PWM pulses, for example in an arrangement of two or more SMA wires 30 or other actuator components. Compensation for shared parasitic resistance improves the accuracy and reliability of actuator control compared to a situation in which no such compensation is provided.

Such compensation may be provided in any situation in which PWM pulses are allowed to overlap. This includes, but is not limited to, PWM pulse overlap according to the aspects described above.

The method for controlling power delivered to the actuator assembly may thus comprise, as an initial step, determining the width of overlap of PWM pulses in each pair of PWM pulses. The duty and/or amplitude of overlapping PWM pulses may be adjusted in dependence on the width of overlap, in particular in a manner that compensates for electrical resistance in a common connection to the actuator components driven by the overlapping pulses. The PWM pulses may be adjusted according to the formulas above, for example. However, in general, a beneficial technical effect may be achieved even when the adjustment is not exactly according to the formulas above, but deviates from the formula above. Any compensation that reduces the power reduction at the actuator components due to the electrical resistance in the common connection compared to a situation in which there is no compensation for electrical resistance in the common connection is advantageous.

Selectively Allowing Overlap of PWM Pulses

Some embodiments of the present invention relate to allowing selective overlap of PWM pulses. For example, a controller may selectively operate in i) a low-power mode in which PWM pulses are applied sequentially, and ii) a high-power mode in which PWM pulses overlap. The terms low-power and high-power here can be considered as relative terms, in that the low-power mode is any mode in which less power is supplied to the actuator components than in the high-power mode. The low-power mode and high-power mode may also be referred to as a first and second mode, where the power supplied to the actuator components is higher in the second mode. This aspect of the invention is applicable in any actuator assembly comprising at least two actuator components, for example two SMA wires 30, that are arranged to move a movable part relative to a support structure.

The embodiments described in relation to FIGS. 2A and 2B are one example of selectively operating in overlapping and non-overlapping modes. With reference to FIG. 2A, in a low-power mode the PWM pulses are relatively narrow and may not overlap. With reference to FIG. 2B, in a high-power mode the PWM pulses are relatively wide and overlap. So, the above-described embodiments inherently give rise to selective operation in a non-overlapping low-power mode and an overlapping high-power mode.

However, the invention of selectively operating modes with non-overlapping and overlapping PWM pulses may be independent from the specific embodiment described with reference to FIGS. 2A and 2B. For example, in the low-power mode, the PWM pulses may be applied in at least two separate sub-slots. In the high-power mode, these sub-slots may be combined into one slot or sub-slot so as to allow the PWM pulses to overlap.

Alternative Embodiments

The above-described SMA actuator assemblies comprise an SMA wire. The term ‘shape memory alloy (SMA) wire’ may refer to any element comprising SMA. The SMA wire may have any shape that is suitable for the purposes described herein. The SMA wire may be elongate and may have a round cross section or any other shape cross section. The cross section may vary along the length of the SMA wire. It is also possible that the length of the SMA wire (however defined) may be similar to one or more of its other dimensions. The SMA wire may be pliant or, in other words, flexible. In some examples, when connected in a straight line between two elements, the SMA wire can apply only a tensile force which urges the two elements together. In other examples, the SMA wire may be bent around an element and can apply a force to the element as the SMA wire tends to straighten under tension. The SMA wire may be beam-like or rigid and may be able to apply different (e.g. non-tensile) forces to elements. The SMA wire may or may not include material(s) and/or component(s) that are not SMA. For example, the SMA wire may comprise a core of SMA and a coating of non-SMA material. Unless the context requires otherwise, the term ‘SMA wire’ may refer to any configuration of SMA wire acting as a single actuating element which, for example, can be individually controlled to produce a force on an element. For example, the SMA wire may comprise two or more portions of SMA wire that are arranged mechanically in parallel and/or in series. In some arrangements, the SMA wire may be part of a larger piece of SMA wire. Such a larger piece of SMA wire might comprise two or more parts that are individually controllable, thereby forming two or more SMA wires.

It will be appreciated that there may be many other variations of the above-described examples.

For example, the present invention has been described in connection with SMA wires 30 that, on contraction, move the movable part 20 relative to the support structure 10. SMA wire is advantageous as an actuator in such an actuator assembly, in particular due to its high energy density which means that the SMA wire required to apply a given force is of relatively small size. However, in general, other actuator components may be used instead of the SMA wires 30. Such actuator components, on actuation, move the movable part 20 relative to the support structure 10. Examples of such actuator components include, but are not limited to, voice-coil motors (VCM), MEMS devices or any other components capable of moving the movable part 20 relative to the support structure 10. Driving such actuator components in accordance with the present invention may have the advantages described herein. Measuring an electrical characteristic of these actuator components, for example an inductance of VCMs, may be used to determine an actuation amount of the actuator components. The determined actuation amount may be used to determine the actual position of a movable part 10 relative to the support structure 20.

The foregoing has described some embodiments of the present invention, but the present invention is not limited to these embodiments. The scope of the invention is defined in the appended claims.

The invention claimed is:

1. A method of controlling power delivered to an actuator assembly comprising at least four actuator components arranged, on actuation, to move a movable part relative to a support structure, the method comprising:

scheduling pulse width modulated (PWM) control signals comprising a series of PWM pulses for driving actuation of the at least four actuator components, wherein the PWM pulses are scheduled in a series of time slots defined by a PWM frequency, each time slot being divided into a plurality of sub-slots;

sorting the PWM pulses by width into pairs, wherein each pair of PWM pulses is scheduled in a respective sub-slot and is allowed to overlap in the respective sub-slot; and determining if the width of any PWM pulse is scheduled to be greater than the width of a respective sub-slot and sorting the PWM pulses by width into pairs upon positive determination thereof.

2. A method of controlling power delivered to an actuator assembly comprising at least four actuator components arranged, on actuation, to move a movable part relative to a support structure, the method comprising:

scheduling pulse width modulated (PWM) control signals comprising a series of PWM pulses for driving actuation of the at least four actuator components, wherein the PWM pulses are scheduled in a series of time slots defined by a PWM frequency, each time slot being divided into a plurality of sub-slots;

sorting the PWM pulses by width into pairs, wherein each pair of PWM pulses is scheduled in a respective sub-slot and is allowed to overlap in the respective sub-slot; and determining if the width of a PWM pulse previously sorted into a lower-width pair exceeds the width of another PWM pulse previously sorted into a higher-width pair by more than a threshold and sorting the PWM pulses by width into pairs upon positive determination thereof.

3. A method according to claim 2, wherein the threshold is 5% of the width of the PWM pulse previously sorted into the lower-width pair.

4. A method of controlling power delivered to an actuator assembly comprising at least four actuator components arranged, on actuation, to move a movable part relative to a support structure, the method comprising:

scheduling pulse width modulated (PWM) control signals comprising a series of PWM pulses for driving actuation of the at least four actuator components, wherein the PWM pulses are scheduled in a series of time slots defined by a PWM frequency, each time slot being divided into a plurality of sub-slots; and sorting the PWM pulses by width into pairs, wherein each pair of PWM pulses is scheduled in a respective sub-slot and is allowed to overlap in the respective sub-slot;

wherein the width of each sub-slot is varied upon the sorting the PWM pulses by width into pairs.

5. A method of controlling power delivered to an actuator assembly comprising at least four actuator components arranged, on actuation, to move a movable part relative to a support structure, the method comprising:

scheduling pulse width modulated (PWM) control signals comprising a series of PWM pulses for driving actuation of the at least four actuator components, wherein the PWM pulses are scheduled in a series of time slots defined by a PWM frequency, each time slot being divided into a plurality of sub-slots; and sorting the PWM pulses by width into pairs, wherein each pair of PWM pulses is scheduled in a respective sub-slot and is allowed to overlap in the respective sub-slot;

wherein the width of each sub-slot is equal to the sum of i) the width of the widest PWM pulse in the sub-slot and ii) a portion of a spare slot width available in the time slot after summing the widths of the widest PWM pulses of the pairs.

6. A method according to claim 5, wherein the portion of the spare slot width is equal for each sub-slot.

7. A method according to claim 6, wherein the portion of the spare slot width in each sub-slot is proportional to the width of the widest PWM pulse in the sub-slot.

8. A method of controlling power delivered to an actuator assembly comprising at least eight actuator components arranged, on actuation, to move a movable part relative to a support structure, the method comprising:

scheduling pulse width modulated (PWM) control signals comprising a series of PWM pulses for driving actuation of the at least eight actuator components, wherein the PWM pulses are scheduled in a series of time slots defined by a PWM frequency, each time slot being divided into a plurality of sub-slots; and sorting the PWM pulses by width into at least four pairs, such that each pair of PWM pulses is applied in a respective sub-slot and is allowed to overlap in the respective sub-slot;

wherein a shortest sub-slot in which the shortest PWM pulse is applied and a longest sub-slot in which the longest PWM pulse is applied are scheduled adjacent to one another at the beginning or at the end of the time slot.

9. A method according to claim 8, wherein the width of each sub-slot is equal to the sum of i) the width of the widest PWM pulse in the sub-slot and ii) a portion of a spare slot width available in the time slot after summing the widths of the widest PWM pulses of the pairs and wherein the portion of the spare slot width allocated to the shortest and to the longest sub-slots is such that the width of the combination of the shortest and the longest sub-slot is half of the time slot.

10. A method of controlling power delivered to an actuator assembly comprising at least four actuator components arranged, on actuation, to move a movable part relative to a support structure, the method comprising:

scheduling pulse width modulated (PWM) control signals comprising a series of PWM pulses for driving actuation of the at least four actuator components, wherein the PWM pulses are scheduled in a series of time slots defined by a PWM frequency, each time slot being divided into a plurality of sub-slots;

sorting the PWM pulses by width into pairs, wherein each pair of PWM pulses is scheduled in a respective sub-slot and is allowed to overlap in the respective sub-slot; and determining the width of overlap of PWM pulses in each pair of PWM pulses, and increasing the duty and/or amplitude of overlapping PWM pulses in dependence on the width of overlap so as to compensate for electrical resistance in a common connection to the actuator components driven by the overlapping pulses, to thereby reduce the power reduction at the actuator components due to the electrical resistance in the common connection compared to a situation in which there is no compensation for electrical resistance in the common connection.

11. A method for controlling power delivered to an actuator assembly comprising at least two actuator components arranged, on actuation, to move a movable part relative to a support structure, the method comprising:

scheduling pulse width modulated (PWM) control signals comprising a series of PWM pulses for driving actuation of the at least two actuator components, wherein at least some of the PWM pulses overlap;

determining the width of overlap of overlapping PWM pulses; and increasing the duty and/or amplitude of overlapping PWM pulses in dependence on the width of overlap so as to compensate for electrical resistance in a common connection to the actuator components driven by the overlapping pulses, to thereby reduce the power loss due to the electrical resistance in the common connection compared to a situation in which there is no common connection to the actuator components.

* * * * *